United States Patent
Masaki

[11] Patent Number: 5,929,978
[45] Date of Patent: Jul. 27, 1999

[54] PROJECTION EXPOSURE APPARATUS

[75] Inventor: Kazuo Masaki, Kawasaki, Japan

[73] Assignee: Nikon Corporation, Tokyo, Japan

[21] Appl. No.: 08/989,077

[22] Filed: Dec. 11, 1997

[51] Int. Cl.[6] .................................................. G03B 27/52
[52] U.S. Cl. .............................. 355/53; 355/67; 356/401; 250/548
[58] Field of Search .................................. 355/43–45, 53, 355/67, 68, 71; 356/399–401; 250/548

[56] References Cited

U.S. PATENT DOCUMENTS

| | | | |
|---|---|---|---|
| 4,780,617 | 10/1988 | Umatate et al. | 250/548 |
| 4,953,960 | 9/1990 | Williamson | 350/442 |
| 5,070,250 | 12/1991 | Komatsu et al. | 250/548 |
| 5,151,750 | 9/1992 | Magome et al. | 356/401 |
| 5,220,454 | 6/1993 | Ichihara et al. | 359/487 |
| 5,654,553 | 8/1997 | Kawakubo et al. | 355/53 |
| 5,691,802 | 11/1997 | Takahashi et al. | 355/53 |
| 5,783,833 | 7/1998 | Sugaya et al. | 356/401 |

FOREIGN PATENT DOCUMENTS 8-304705  11/1996  Japan .

*Primary Examiner*—D. Rutledge
*Attorney, Agent, or Firm*—Foley & Lardner

[57] ABSTRACT

A projection exposure apparatus including a projection optical system for projecting a pattern formed in a reticle onto a photosensitive substrate, and an alignment system for positioning the reticle and the photosensitive substrate with respect to each other by observing a reticle mark alignment formed on the reticle and a substrate alignment mark formed on the photosensitive substrate; wherein the alignment system comprises an imaging section having an imaging surface tilted with respect to an optical axis of the alignment system and with respect to a direction orthogonal to a measuring direction for each of the alignment marks, the imaging section having respective best focus positions for the alignment marks at different positions on the imaging surface; and wherein the alignment marks are simultaneously detected at the respective best focus positions so as to position the reticle and the photosensitive substrate with respect to each other. The best focus positions are determined by the focus detecting section within the image processing system according to image signals obtained from the imaging section.

6 Claims, 7 Drawing Sheets

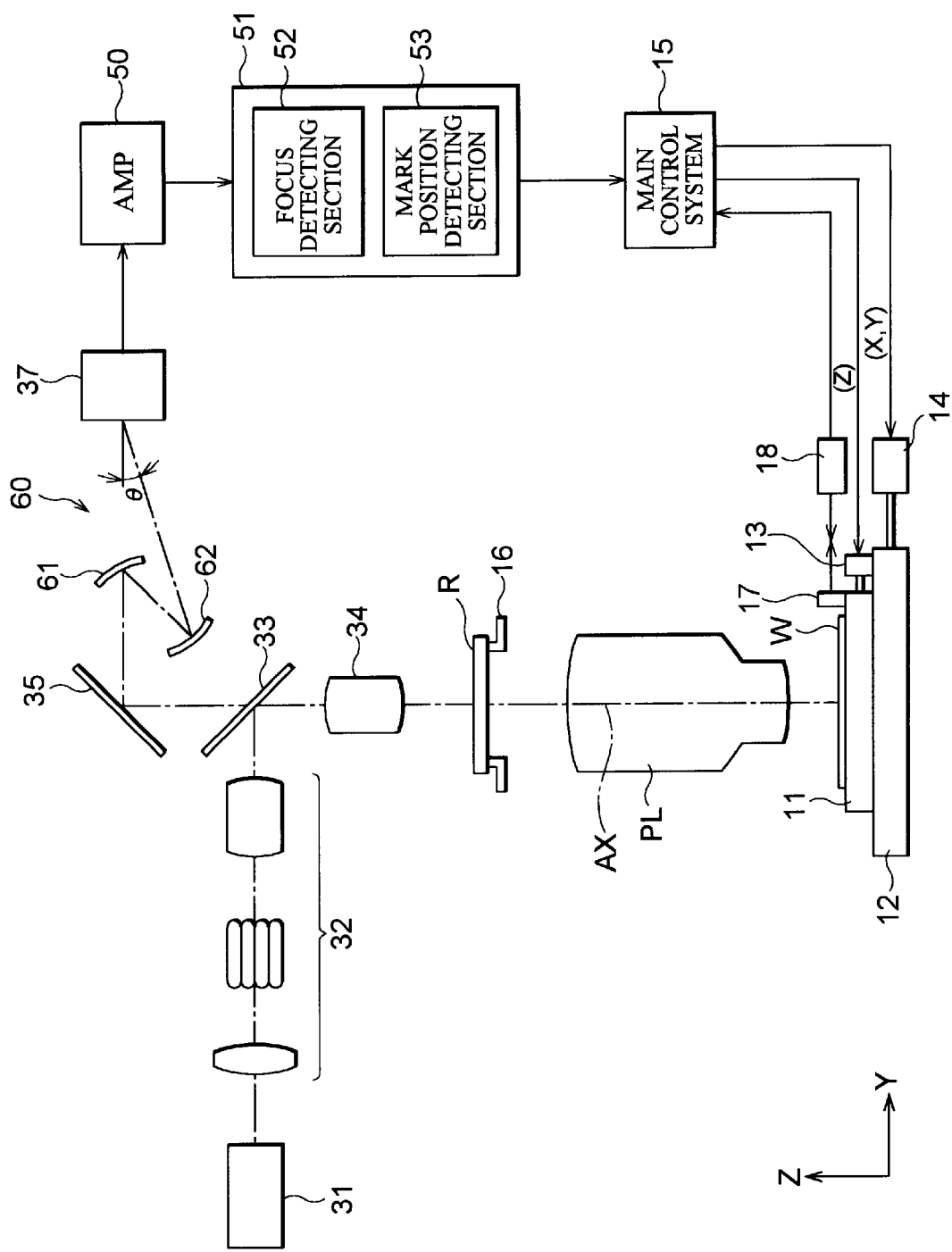

PROJECTION EXPOSURE APPARATUS

BACKGROUND OF THE INVENTION

1. Field of the Invention

The present invention relates to a projection exposure apparatus used in photolithography process for making semiconductor devices and liquid crystal display devices and, in particular, to a projection exposure apparatus equipped with an alignment system which captures images of a reticle alignment mark formed in a reticle and a substrate alignment mark formed in a photosensitive substrate, subjects thus captured images to image processing, and positions the reticle and the photosensitive substrate with respect to each other.

2. Related Background Art

In a photolithography process for making semiconductor devices, liquid-crystal display devices, CCD imaging devices, and the like, a projection exposure apparatus is used so as to expose and transfer a pattern image formed on a reticle or photomask (hereinafter simply referred to as reticle) onto a photosensitive substrate, such as semiconductor wafer or glass plate, which is coated with a photosensitive material. Since a number of layers of circuit patterns are formed on a photosensitive substrate in general, in order to improve the yield of semiconductor devices or the like manufactured, it is necessary for a high overlay accuracy to be maintained between the pattern that has already been formed in each shot area on the photosensitive substrate and a pattern image of the reticle to be transferred and exposed thereon. To this end, the position of a substrate alignment mark (hereinafter simply referred to as wafer mark) disposed at each shot area on the photosensitive substrate is detected with a high accuracy by means of an alignment system and, based on thus detected position, the positions of photosensitive substrate and reticle are spatially adjusted with respect to each other.

Such an alignment system is disclosed in U.S. Pat. No. 5,151,750 or the like and encompasses LSA (Laser Step Alignment) system in which an alignment mark formed like a dot series is irradiated with laser light, and light diffracted or scattered by the alignment mark is used to detect the position of alignment mark; LIA (Laser Interferometric Alignment) system in which a grating-like alignment mark is irradiated, for example, with laser beams whose frequencies are slightly different from each other respectively from two directions, the resulting two diffracted light components are caused to interfere with each other, and the position of alignment mark is measured from their phases; FIA (Field Image Alignment) system in which image data of an alignment mark captured under illumination of light having a broad wavelength bandwidth whose light source is a halogen lamp are subjected to an image processing so as to be measured; and the like.

On the other hand, in terms of kinds of optical systems used for alignment adjustment, the alignment systems can be roughly divided into TTL (though-the-lens) system in which the position of photosensitive substrate is measured through a projection optical system; TTR (through-the-reticle) system in which the positional relationship between the reticle and the photosensitive substrate is measured through the projection optical system and the reticle; and off-axis system in which the position of photosensitive substrate is directly measured without the aid of a projection optical system.

The illumination light (alignment light) for illuminating the alignment mark may be either nonexposure light having a wavelength which is outside the photosensitive range of the photosensitive layer on the photosensitive substrate and is different from that of exposure light, or the exposure light itself. Since the projection optical system of the projection exposure apparatus is corrected in terms of aberration with respect to exposure light, it may yield a large amount of aberration, such as chromatic aberration in particular, with respect to nonexposure light. Accordingly, in the case where nonexposure light is used as alignment light, a lens for correcting chromatic aberration is employed therewith.

SUMMARY OF THE INVENTION

It has been necessary, however, for conventional TTR alignment type projection exposure apparatus to set different focus positions respectively for exposure and alignment, thus requiring the focus position to change over upon each alignment operation. Also, while the wafer mark is typically made of an irregularity pattern, contrast of a captured wafer mark image depends on the vertical difference in this irregularity pattern. It has recently been required for the irregularity of wafer mark to reduce its level difference. In order to detect such a wafer mark having a small level difference with a high contrast, it has been necessary to increase focus accuracy.

In view of such problems of the prior art, it is an object of the present invention to provide a projection exposure apparatus equipped with an alignment system which can simultaneously detect a reticle mark and a wafer mark with a high accuracy without moving a wafer stage up and down, so as to effect their alignment.

In order to achieve the above-mentioned object, the present invention provides a projection exposure apparatus which projects a pattern formed in a reticle onto a photosensitive substrate through a projection optical system, the apparatus being equipped with an alignment system for positioning the reticle and the photosensitive substrate with respect to each other by observing a reticle mark formed on the reticle and a wafer mark formed on the photosensitive substrate.

The alignment system comprises an imaging section having an imaging surface tilted with respect to an optical axis of the alignment system and with respect to a direction orthogonal to a measuring direction for each mark, and positions the reticle and the photosensitive substrate with respect to each other by simultaneously detecting their respective marks at their corresponding best focus positions.

When the imaging surface of the imaging section is tilted with respect to the optical axis of the alignment system, the imaging surface covers a certain constant range of distance in the optical axis direction, whereby a part of the reticle mark and a part of the wafer mark can respectively be made conjugate with different parts of the imaging surface. Also, since the imaging surface is not tilted with respect to the measuring direction of each mark, measurement of each mark does not differ at all from that in a non-tilted imaging surface. Further, since a part of the reticle mark and a part of the wafer mark respectively attain their best focus states at positions different from each other on the imaging surface of the imaging section, these marks can be simultaneously measured at their respective best focus positions. Namely, the reticle mark and the wafer mark can be detected at the same time with a high accuracy without moving the substrate stage up and down.

Preferably, the imaging surface has an angle of inclination variable with respect to the optical axis. As a result, images of the reticle mark and wafer mark at their best focus positions can be securely captured.

The apparatus may be configured such that, based on thus captured images, the respective best focus positions of the marks are determined by an image processing circuit, and the marks are measured at thus detected best focus positions corresponding thereto. Also, in the case where the alignment system is set such that the best focus position of the reticle mark is located at a predetermined position on the imaging surface of the imaging section, whereby the best focus position of the reticle mark is known beforehand, the reticle mark may be measured at thus known best focus position, whereas only the best focus position of the wafer mark may be detected by an image processing circuit, and the wafer mark may be measured at thus detected best focus position.

As such an image processing technique, for example, the following processing methods can be employed. An image signal is obtained as a signal intensity variation in response to whether a mark exists or not (difference in contrast between the mark and its ground). In general, edges of a mark have profiles (degrees of acuteness of edges in a cross section of a mark) slightly different from each other depending on the influence incurred when the mark is formed and their defocus states. At the best focus position, since the edge profile is acute, a differential signal obtained when an image signal is differentiated yields large extreme values. Namely, from the differential signal, the best focus position and a correct mark position can be detected.

Further, the photosensitive substrate may be provided with a plurality of photosensitive layers for forming a number of layers of circuit patterns, and a plurality of wafer marks which respectively correspond to these layers and are respectively formed at positions whose depths from the wafer surface differ from each other; and these plurality of wafer marks may be simultaneously detected at their respective best focus positions.

Conventionally, there has been such a problem that profiles of edges of a wafer mark disposed at each layer of a photosensitive substrate are defocused due to an optical path difference between layers, thereby becoming blunt or yielding a weak signal. In accordance with the present invention, by contrast, the wafer marks respectively disposed at the individual layers can be measured at the same time with a high accuracy under their best focus states. Also, recently, in order to make a semiconductor device having a high degree of integration and a high resolution, the photosensitive layer has become substantially as thin as the wavelength of exposure light employed, and a substrate alignment mark having a small level difference has been used, thus requiring the wafer mark to be measured in the best focus state in order to effect highly accurate measurement for alignment with an enhanced contrast of the wafer mark. The present invention can also respond to such a requirement. Alignment accuracy can further be improved when an amount of deviation between the reticle and wafer measured by means of each wafer mark is averaged, for example.

BRIEF DESCRIPTION OF THE DRAWINGS

FIG. 2A is a plan view showing a shot area on a wafer and an arrangement of wafer marks, whereas

FIG. 3A is a simulated view of an exposure optical system and an alignment optical system, whereas

FIG. 4A is a view for explaining scanning lines on a mark image, FIG. 4B is a view for explaining a signal waveform obtained from a scanning line with which a wafer mark is scanned at its best focus position, FIG. 4C is a view for explaining a signal waveform obtained from a scanning line with which the wafer mark is scanned at a position other than the best focus position, FIG. 4D is a signal waveform with which a reticle mark is scanned at its best focus position, FIG. 4E is a view for explaining a signal waveform obtained from a scanning line with which the reticle mark is scanned at a position other than the best focus position, and FIG. 4F is a view for explaining an operation for determining an amount of deviation between the reticle mark and the wafer mark from a detected signal;

FIG. 7 is a schematic view showing another example of projection exposure apparatus in accordance with the present invention.

DETAILED DESCRIPTION OF THE PREFERRED EMBODIMENTS

In the following, embodiments of the present invention will be explained with reference to the accompanying drawings. Here, for easier understanding, constituents identical to each other are referred to with the same numerals as much as possible, without their overlapping descriptions being repeated.

Figure 1:
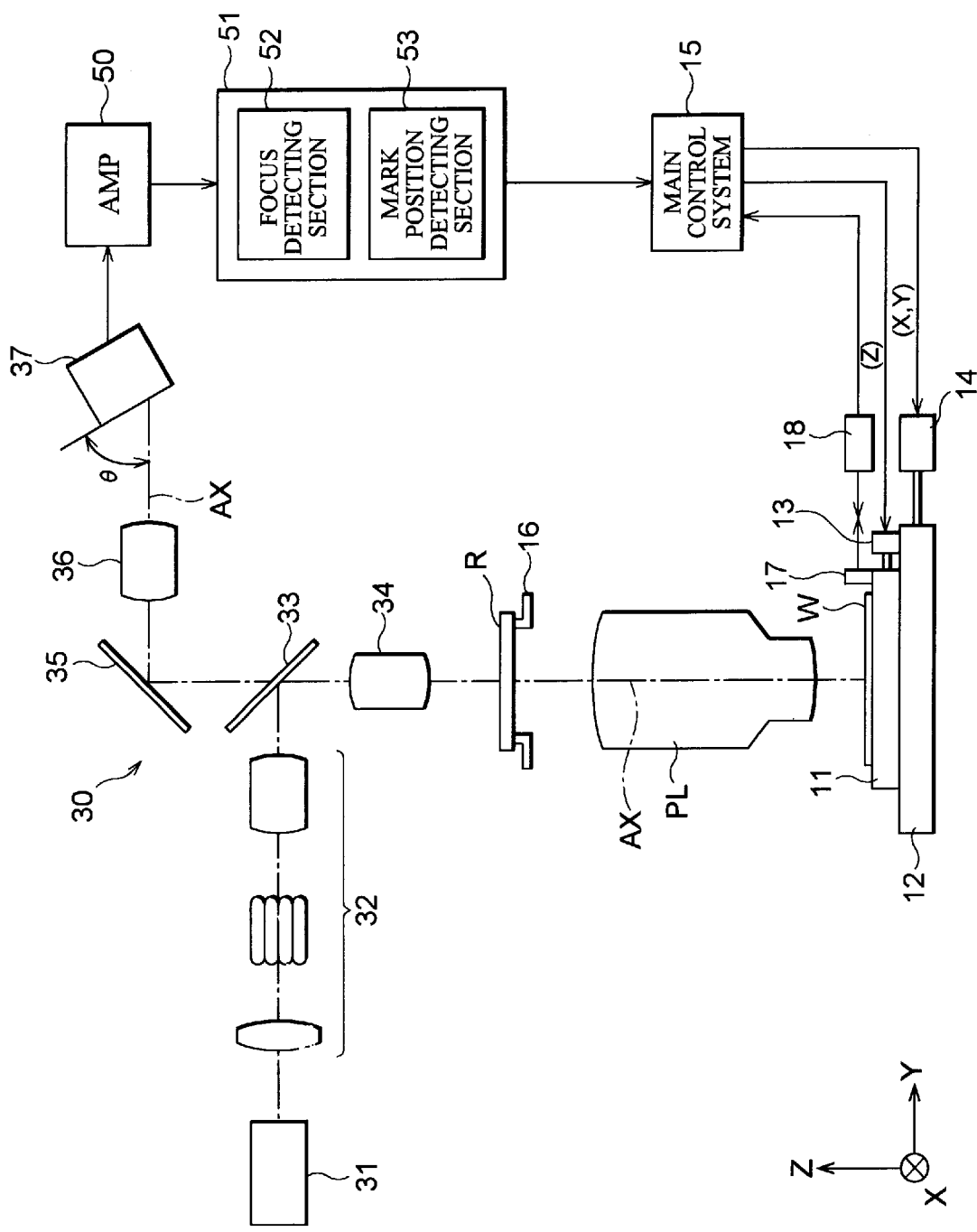
FIG. 1 is a schematic view showing an example of projection exposure apparatus in accordance with the present invention.

FIG. 1 is a view showing a schematic configuration of an example of projection exposure apparatus having a TTR alignment system in accordance with the present invention. In FIG. 1, a direction in parallel to an optical axis AX of a projection optical system PL is designated as Z direction, a direction perpendicular to Z direction within the paper surface as Y direction, and a direction perpendicular to the paper surface and Z direction as X direction.

A wafer W is mounted on a non-depicted leveling stage, which is disposed on a Z stage 11 that can minutely be moved in the optical axis direction (Z direction) of the projection optical system PL by means of a driving motor 13. The Z stage 11 is mounted on an XY stage 12 which is movable in two-dimensional directions (XY directions) by a driving motor 14 in a step-and-repeat manner. A reticle R is mounted on a reticle stage 16 which can be moved two-dimensionally within a horizontal plane. Exposure light from an exposure light source 31 uniformly illuminates, by way of a flyeye illumination optical system 32, a half mirror 33, and an objective lens 34, a pattern formed in the reticle R, whereby a pattern image of the reticle R is exposed and transferred to a shot area on the wafer W by the projection optical system PL. Usable as this exposure light is the one having a wavelength of KRF, ARF, F2, or the like.

After a pattern of the reticle R corresponding to one shot area on the wafer W is completely exposed and transferred thereto, the XY stage 12 is moved stepwise such that the next shot area on the wafer W coincides with the exposure area of the projection optical system PL. The two-dimensional position of the leveling stage, on which the wafer W is mounted, is constantly monitored, e.g., with a resolution on the order of 0.01 $\mu$m, as its distance from a movable mirror 17 secured to the leveling stage is measured by a laser interferometer 18, whose output is fed to a main control system 15.

The reticle R is positioned on the reticle stage 16 such that the center of a transfer pattern on the reticle R coincides with the optical axis AX of the projection optical system PL. The reticle R is positioned by use of a plurality of reticle alignment marks (reticle marks) disposed in the vicinity of the outer periphery of the reticle R. Provided are two kinds of reticle marks, i.e., those for effecting positioning in X direction and those for positioning in Y direction. A TTR alignment system 30 uses, as illumination light (alignment light), an exposure light component branching out from the exposure light from the exposure light source 31. Though only one TTR alignment system is shown in FIG. 1, TTR alignment systems are disposed one by one at the discrete reticle alignment mark positions.

The illumination light passing through the flyeye illumination optical system 32, half mirror 33, and objective lens 34 is made incident on the reticle mark disposed outside the pattern area of the reticle R. The reticle mark comprises, for example, a rectangular transparent window formed at an opaque section surrounding the pattern. By way of the objective lens 34, the half mirror 33, a mirror 35, and a magnifying lens 36, the alignment light reflected by the reticle mark section is made incident on a two-dimensional imaging section 37 made of a CCD camera or the like. The two-dimensional imaging section 37 is disposed near an imaging surface of the magnifying lens 36 such that its image-receiving surface is tilted with respect to the optical axis AX by a predetermined angle $\theta$ toward an object to be measured.

On the other hand, the alignment light transmitted through the reticle mark passes through the projection optical system PL so as to be made incident on a substrate alignment mark (wafer mark) disposed around each shot area on the wafer W. Instead of being disposed around each shot area, the wafer mark may also be disposed at only a predetermined position of the wafer such as an outer peripheral region of the wafer, for example. As with the reticle marks, provided are two kinds of wafer marks for positioning in X and Y directions, respectively. The light reflected from the wafer mark travels a path directed opposite to that of incident light, thus passing through the reticle mark section and further, by way of the objective lens 34, half mirror 33, mirror 35, and magnifying lens 36, becoming incident on the two-dimensional imaging section 37.

Figure 2A:
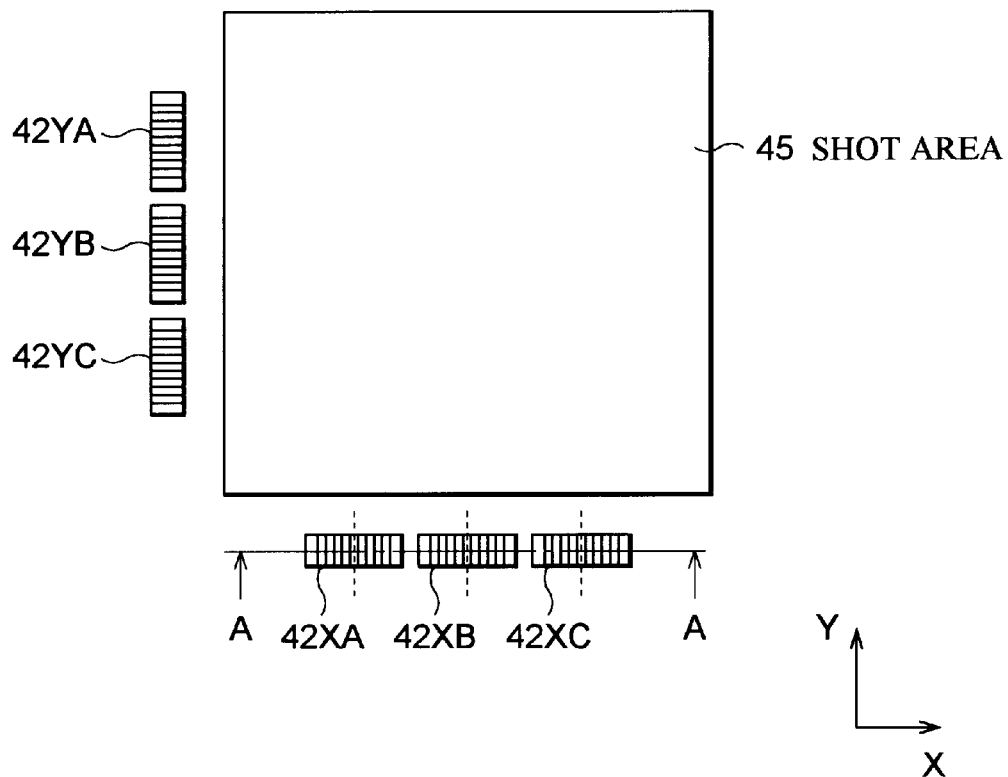
Figure 2B:
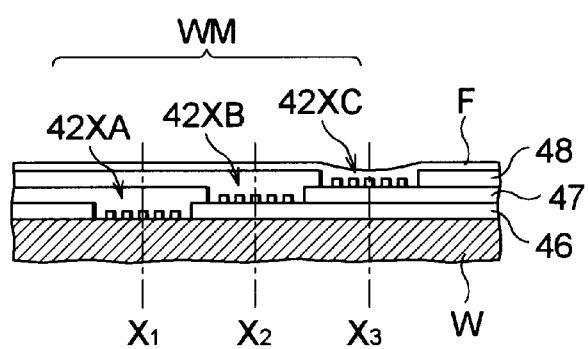
FIG. 2B is a sectional view of a major part thereof taken along line A—A of FIG. 2A.

FIGS. 2A and 2B are views for explaining an example of arrangement of wafer marks. FIG. 2A is a plan view of wafer marks disposed at and around one shot area, whereas FIG. 2B is a sectional view thereof taken along line A—A. A shot area 45 has already been formed with a plurality of pattern layers 46, 47, and 48, and the next pattern exposure is effected after a photosensitive layer F is coated thereon. Disposed at each shot area 45 are wafer marks 42XA, 42XB, and 42XC for positioning in X direction, and wafer marks 42YA, 42YB, and 42YC for positioning in Y direction. Each wafer mark in this example is made of a so-called line-and-space pattern in a bar-code form constituted by an array of linear grooves and protrusions. Alignment of the shot area 45 in X direction can be effected, for example, when the center position X3 of the wafer mark 42XC formed in the uppermost pattern layer 48 is detected, and then the shot area 45 is positioned with respect to thus detected position.

When the photosensitive layer F is made substantially transparent to the alignment light, the reflected signal from the wafer mark 42XC is hard to be absorbed by the photosensitive layer F, thus increasing its signal intensity. Further, when each of the layers 46, 47, and 48 also exhibits a higher transmissivity with respect to this alignment light, not only the reflected signal from the wafer mark 42XC on the uppermost layer but also the reflected signals from the wafer marks 42XB and 42XA on the lower layers are outputted from the wafer surface without being absorbed by their upper layers. As a result, these signals can be directly observed by the two-dimensional imaging section 37 of the alignment system 30 shown in FIG. 1. Accordingly, even in the case where the positional information representative of the center position X3 of the wafer mark 42XC on the uppermost layer cannot be read out for a certain reason, information concerning the center position X2 of the wafer mark 42XB of the layer thereunder or the center position X1 of the wafer mark 42XA of the layer further therebelow can be used for effecting alignment. Further, a plurality of wafer marks, e.g., two wafer marks 42XB and 42XC, may be employed so that alignment errors determined by use of the respective center positions X2 and X3 compensate for each other, thereby allowing highly accurate alignment to be effected.

The output signal from the two-dimensional imaging section 37 is amplified by an amplifier 50 and then is fed into an image processing circuit 51. The image processing circuit 51 realizes functions of a focus detecting section 52 and a mark position detecting section 53 by means of software or hardware. The focus detecting section 52 detects best focus positions for images of a reticle mark RM and a wafer mark WM, whereas the mark position detecting section 53 detects the center position of each mark at thus detected best focus position thereof. Information concerning an amount of deviation between the center positions of thus detected reticle mark RM and wafer mark WM is fed to the main control system 15, which then controls the XY stage driving motor 14 so as to drive the XY stage 12, thereby effecting alignment.

Figure 3A:
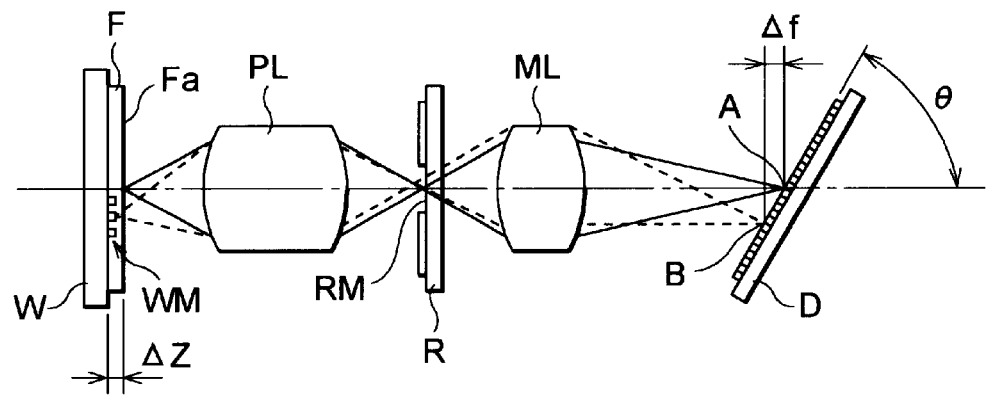

Explained in the following is a method of detecting the best focus position for each mark in the image processing circuit 51 from the image captured by the imaging section 37. FIG. 3A is a view simulatively showing the exposure optical system and alignment optical system shown in FIG. 1. Formed on the wafer W is a wafer mark WM made of a line-and-space pattern, on which the photosensitive layer F is coated. Formed on the lower surface of the reticle R is a reticle mark RM made of a rectangular transparent window disposed at an opaque section surrounding the pattern. Here, in FIG. 3A, in order to illustrate a cross section of the wafer mark WM, the wafer is depicted as being rotated by 90° around the optical axis. The alignment light reflected by the reticle mark RM is made incident on a two-dimensional imaging section D via an objective lens ML. By contrast, the alignment light that has passed through the reticle mark RM, has reached the wafer mark WM by way of the projection optical system PL, and then has been reflected by the wafer mark WM passes through the projection optical system PL and the reticle mark RM again and then is made incident on the two-dimensional imaging section D via the objective lens ML.

Here, the pattern (not depicted) formed on the lower surface of the reticle R and a surface Fa of the photosensitive layer F are conjugate with each other with respect to the projection optical system PL. Accordingly, the reticle mark RM formed on the lower surface of the same reticle R is conjugate with the surface Fa of the photosensitive layer F. Due to the objective lens ML, the reticle mark RM has its best focus position at a position A on the imaging surface of the two-dimensional imaging section D disposed so as to be tilted with respect to the optical axis by an angle of inclination θ. On the other hand, due to the objective lens ML, the wafer mark WM, which is overlaid with the thickness of the photosensitive layer F on the wafer W, forms an image at a position closer to the objective lens ML than is the position A. Here, since the two-dimensional imaging section D is tilted with respect to the optical axis by the angle of inclination θ, the best focus position is located at a position B where its image-receiving surface intersects with the above-mentioned image-forming position. Accordingly, images of the reticle mark RM and wafer mark WM at their best focus positions can be simultaneously captured at different positions on the imaging surface.

For example, assuming that a composite magnification of the projection optical system PL and objective lens ML is 50x, and that the level difference between the surface Fa of the photosensitive layer F coated on the wafer W and the wafer mark WM is Δz=3 μm, an approximate amount of deviation in focus between an image IW of the wafer mark WM and an image IR of the reticle mark RM on the two-dimensional imaging section D is Δf=7.5 mm. Namely, Δf is the distance between the positions A and B in the optical axis direction.

Figure 3B:
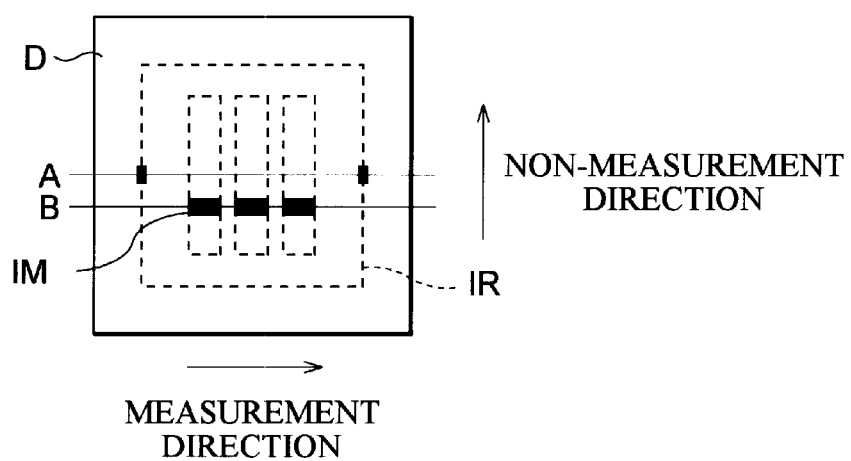
FIG. 3B is a conceptual view showing focusing states of a reticle mark image and a wafer mark image formed on its two-dimensional imaging section.

FIG. 3B conceptually shows focusing states of the image IR of the reticle mark RM and image IW of the wafer mark WM that are formed on the two-dimensional imaging section D. The image IR of the reticle mark RM made of a rectangular window attains its maximum contrast on a line A where its best focus position exists, while yielding a defocused image with a low contrast at the other positions. On the other hand, the image IW of the wafer mark WM made of a line-and-space pattern maximizes its contrast on a line B where its best focus exists, while lowering the contrast at the other positions.

The best focus positions A and B of the respective mark images on the two-dimensional imaging section D disposed so as to be tilted with respect to the optical axis can be determined by optical calculation or image processing. In a method based on optical calculation, from the thickness d of the photosensitive layer F coated on the wafer mark WM and the composite magnification m of the projective optical system PL and objective lens ML, the deviation in focus Δf=md is determined, and then, from the deviation in focus Δf and the angle of inclination θ of the two-dimensional imaging section D with respect to the optical axis, a distance 1 between the best focus position of the respective mask images in the image captured by the two-dimensional imaging section D is determined according to the following equation:

$$l = \Delta f / \cos \theta.$$

Figure 4A:
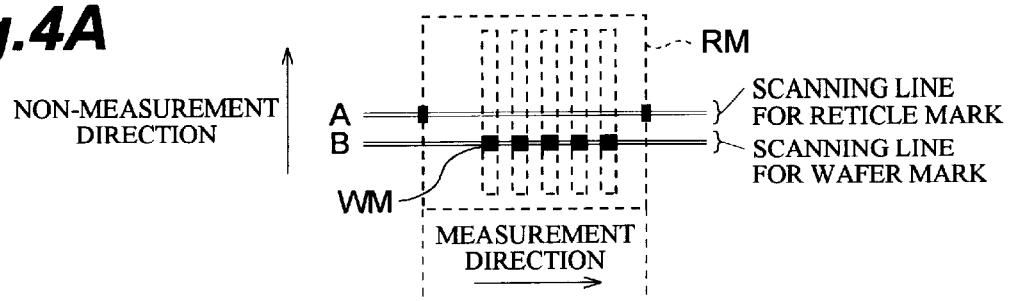
FIGS. 4A to 4F are explanatory views for an image processing for determining a best focus position, namely.
Figure 4B:
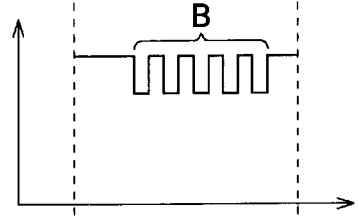
Figure 4C:
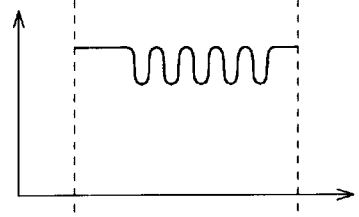
Figure 4D:
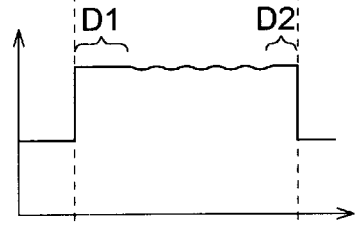
Figure 4E:
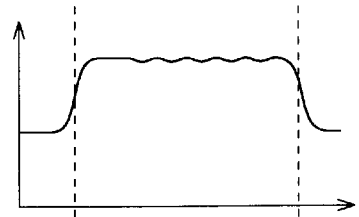

In the following, a method based on image processing will be explained. FIGS. 4A to 4F are explanatory views of a method of determining the best focus positions of the respective mask images according to image processing. This image processing is performed by the focus detecting section 52 of the image processing circuit 51. In this method, as shown in FIG. 4A, an image of alignment marks is finely divided into pixels (not depicted) two-dimensionally arranged in a measurement direction, which is the alignment direction of the line-and-space pattern of the wafer mark WM, and a non-measurement direction orthogonal thereto; each row of pixels aligned in the measurement direction is used as a scanning line; waveforms of image signals obtained by sequentially reading out the signals of the respective scanning lines are compared with each other; and the position of the scanning line with the steepest edge signal is defined as the best focus.

First, detection of the best focus position of the wafer mark WM will be explained. Since the wafer mark image has a high contrast at the best focus position, a scanning line B which has scanned the wafer mark WM at the best focus position yields a signal waveform with steep edges such as that shown in FIG. 4B. By contrast, a scanning line which has scanned the wafer mark WM at a position other than the best focus position yields a signal waveform with blunt edges such as that shown in FIG. 4C, for example. By comparing these signal waveforms with each other, the focus detecting section 52 detects the best focus position B of the wafer mark WM. Similarly, a scanning line A which has scanned the reticle mark RM at its best focus position yields a signal waveform with steep edges such as that shown in FIG. 4D, whereas other scanning lines yield a signal waveform with blunt edges such as that shown in FIG. 4E. Accordingly, the focus detecting section 52 can determine the best focus position A of the reticle mark RM.

Figure 4F:
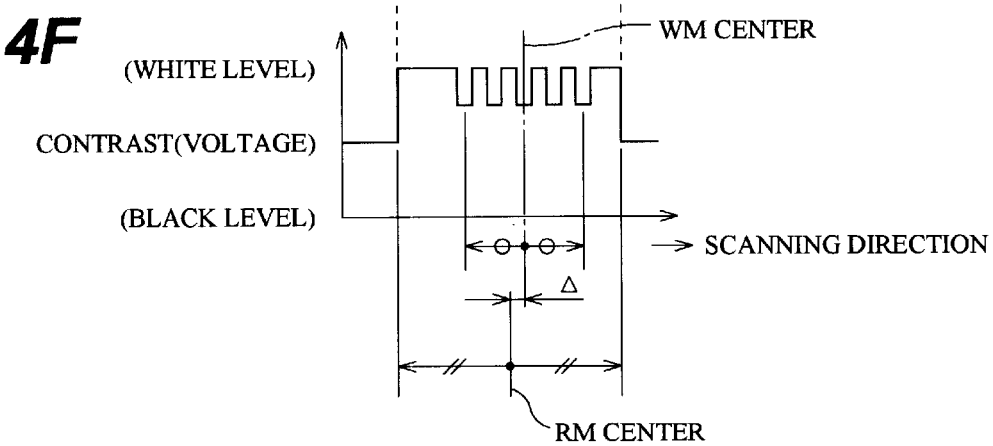

After the respective best focus positions of the wafer mark WM and reticle mark RM are detected, the mark position detecting section 53 of the signal processing means 51 feeds therein the image signals of the wafer mark WM and reticle mark RM at their respective best focus positions. Namely, the image signal B of the wafer mark WM is taken in from the signal waveform of FIG. 4B obtained when the wafer mark WM is scanned at its best focus position, whereas image signals D1 and D2 of the reticle mark RM are taken in from the signal waveform of FIG. 4D obtained when the reticle mark RM is scanned at its best focus position. Thus obtained signals are combined together, for example as shown in FIG. 4F; the respective center positions of the reticle mark RM and wafer mark WM are determined from their corresponding edge positions of the signals; and the amount in deviation Δ of the center position of the wafer mark WM with respect to the center position of the reticle mark RM is determined. When the XY stage 12 is driven according to the deviation amount Δ so as to align shot areas on the wafer W with each other, desired overlaying can be effected with a high accuracy.

Also, when the angle of inclination θ of the two-dimensional imaging section D with respect to the optical axis is changed by a variable mechanism using a motor or the like, it can respond to the wafer mark WM having any level difference ranging from high to low. The angle of inclination θ is set such that the best focuses of all the necessary alignment marks can be obtained on the two-dimensional imaging section D according to the information about the film thickness Δz of the photosensitive layer F, information about the depth of the wafer mark WM, and the like. Though the foregoing explanation relates to a case where exposure light is used as alignment light, the present invention is also applicable to a projection exposure apparatus equipped with an alignment system which employs an aberration correcting lens so as to perform alignment by using nonexposure light.

Figure 5:
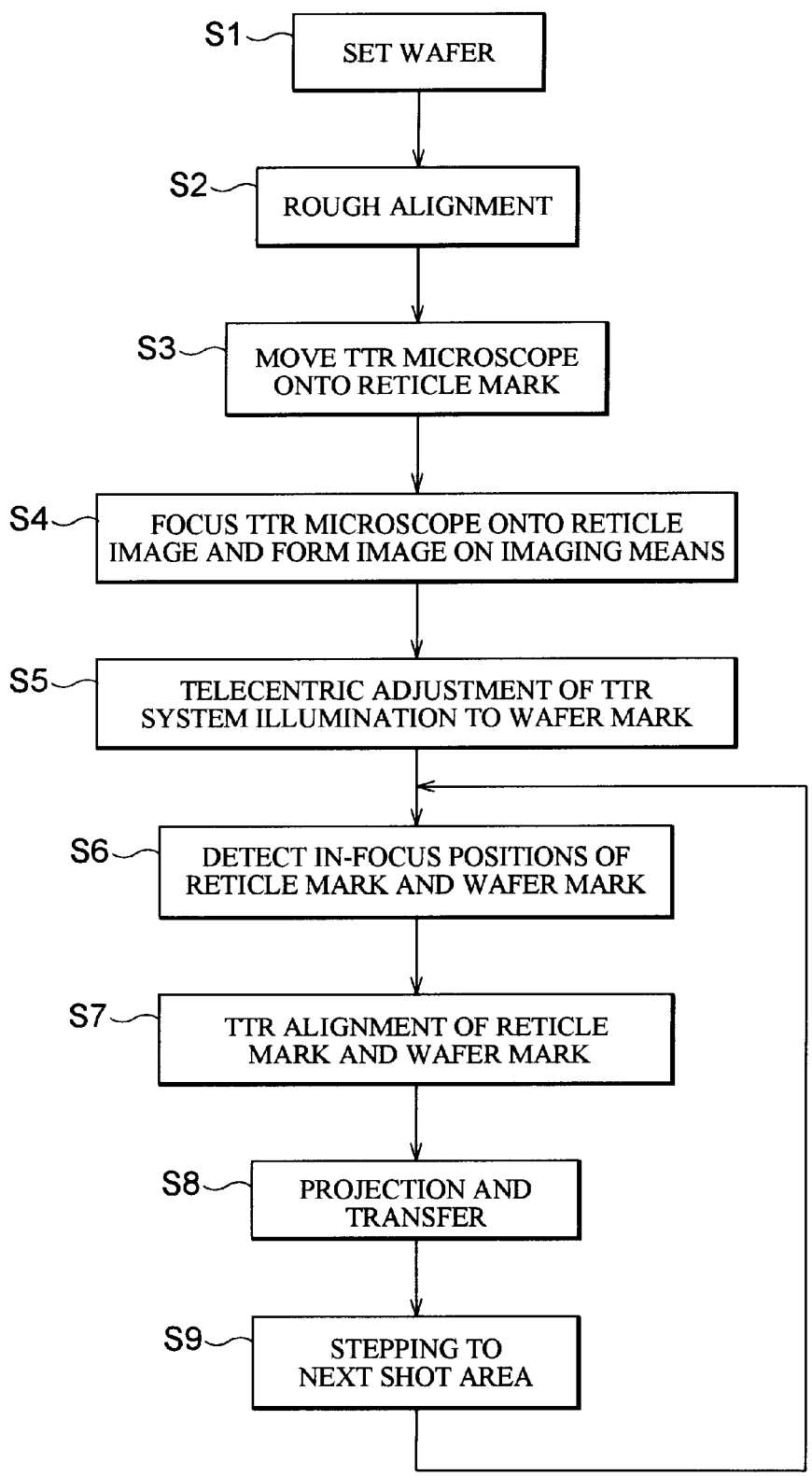
FIG. 5 is a flowchart showing an alignment and exposure sequence in accordance with the projection exposure apparatus of the present invention.

In the following, with reference to FIG. 5, an exposure sequence according to die-by-die alignment in a projection exposure apparatus will be explained. At step 1, the wafer W is loaded on a substrate stage, such that one shot area on the wafer W is located directly under the optical axis AX of the projection optical system. At step 2, a plurality of wafer mark positions on the wafer W are detected, and the positional deviation of the wafer W in X direction, Y direction, and Θ (rotational) direction with respect to XY orthogonal coordinate system, defined by two sets of interferometers, is corrected (rough alignment). Then, at step 3, the TTR alignment system (TTR microscope) 30 is moved onto the reticle mark. The TTR microscope is thus moved because (1), upon destruction of the wafer mark due to a process such as etching or the like, it may become necessary to rewrite the wafer mark, thus altering the position of the reticle mark on the reticle, (2) the reticle size may change, and so on. When there is neither rewritten wafer mark nor change in reticle size, the step 3 is omitted.

At step 4, focusing onto the reticle mark RM is effected by means of the objective lens 34. Here, the focusing action with respect to the reticle mark RM is necessary in the TTR alignment system since thickness may differ among reticles. At step 5, the inclination of the principal ray of the alignment system 30 is adjusted (which is referred to as telecentric adjustment). Namely, on the wafer W side of the projection optical system PL, the principal ray of the exposure light for illuminating the reticle pattern is caused to substantially coincide with the principal ray of the TTR alignment system 30. As a result of the foregoing steps, the TTR alignment system 30 becomes in focus with the reticle mark RM, i.e., the reticle mark RM is optically conjugate with the imaging surface of the two-dimensional imaging section 37, while the telecentric adjustment of the TTR alignment system 30 is completed.

Subsequently, at step 6, the focus detecting section 52 of the image processing circuit 51 detects the respective best focus positions of the reticle mark RM and wafer mark WM. Then, at step 7, the mark position detecting section 53 detects an amount of deviation between the center positions of the reticle mark RM and wafer mark WM at their best focus positions detected at step 6, whereas the main control system 15 drives the XY stage 12 by the driving motor 14, thereby effecting alignment. After the alignment is completed, exposure of the above-mentioned shot area is effected at step 8. After the exposure, at step 9, the XY stage 12 is moved stepwise in X and Y directions so that the optical axis of the projection optical system PL opposes the next shot area. Thereafter, the steps 6 to 9 are repeatedly executed, whereby all the shot areas on the wafer are successively exposed to light.

In the alignment and exposure sequence in accordance with the present invention, the wafer mark and reticle mark can be simultaneously caused to be in focus. Consequently, as compared with the conventional apparatus in which it has been necessary to move a Z stage in order to place each of the wafer mark and reticle mark into an in-focus state, the process for moving up/down the Z stage is unnecessary, thereby shortening the process and improving its throughput.

Figure 6:
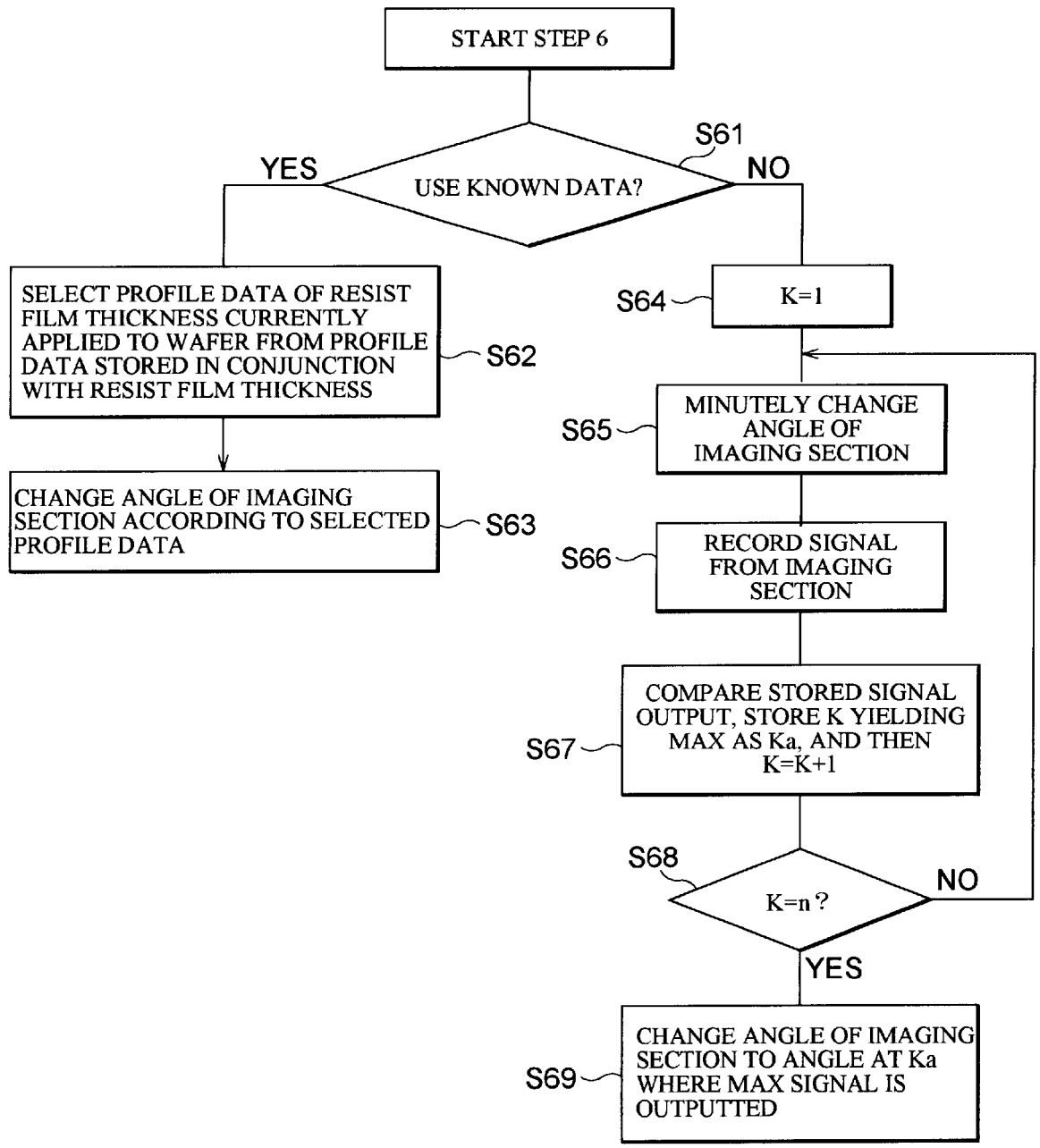
FIG. 6 is a flowchart showing an angle-changing sequence of an imaging section in accordance with the projection exposure apparatus of the present invention.

Here, a sequence for changing the angle of inclination θ of the imaging section will be explained with reference to FIG. 6. This sequence is the initial process in the step 6 of detecting the in-focus positions of the marks in the exposure and alignment sequence shown in FIG. 5.

When the step 6 is started, it is initially selected at step 61 whether the angle of the imaging section is to be altered by utilizing known data or by utilizing newly captured data. In the case where known data are utilized, at step 62, profile data corresponding to the film thickness of the resist currently applied to the wafer are selectively read out from image profile data which are prerecorded in conjunction with their corresponding resist film thickness values. At step 63, the angle of the imaging section is changed according to thus selected profile data. In the case where newly captured data are used, by contrast, initially at step 64, K indicating the number of steps of its repeating routine is set to 1. Then, at step 65, the angle of inclination of the imaging section is changed by a minute angle. At step 66, a signal from the imaging section is recorded. At step 67, this output signal from the imaging section is compared with the maximum output signal obtained so far and, if the current output signal is the largest, K at this time is stored as Ka and then 1 is added to K. At step 68, it is determined whether K has reached a predetermined loop number n or not, and if not, the steps 65 to 67 are repeated. If it has reached the loop number n, the loop processing is terminated, whereby the flow proceeds to step 69. At step 69, the angle of the imaging section is adjusted to the angle of inclination in the case of Ka where the maximum signal is outputted. Consequently, regardless of the resist film thickness, the imaging section can be adjusted to its optimal angle of inclination.

FIG. 7 is a view showing a schematic configuration of another example of the projection exposure apparatus in accordance with the present invention. FIG. 7 differs from FIG. 1 only in its alignment system. Accordingly, only the alignment system will be explained. In an alignment system 60 of this example, in place of the magnifying lens 36, reflectors 61 and 62 constitute a magnifying optical system, while its incident optical axis with respect to the imaging surface of the two-dimensional imaging section 37 is tilted. The projection exposure apparatus of this example can also yield effects similar to those of the projection exposure apparatus mentioned above. In addition, the catadioptric optical system disclosed in Japanese Patent Application Laid-Open No. 8-304705 and various kinds of optical systems disclosed in U.S. Pat. No. 4,953,960 can be used.

Though the foregoing explanation relates to an example in which the present invention is used in an exposure sequence based on die-by-die alignment; without being restricted to such an alignment system, the present invention is also applicable to the enhanced global alignment (EGA) system disclosed in U.S. Pat. No. 4,780,617.

In accordance with the present invention, when a pattern formed on a reticle is exposed in an overlaying manner onto a plurality of layers of patterns which have already been formed on the wafer, a reticle mark and the respective wafer marks forming a level difference on the wafer can be measured simultaneously at their best focus positions. Since it is unnecessary to use defocused mark detection signals, the positioning accuracy and overlay accuracy of alignment marks can be improved.

Also, since it is unnecessary to position each wafer mark by moving the focusing objective lens of the alignment optical system or moving the Z stage on the substrate stage in the optical axis direction as previously required, throughput can be improved in die-by-die alignment.

What is claimed is:

1. A projection exposure apparatus including a projection optical system for projecting a pattern formed in a reticle onto a photosensitive substrate, and an alignment system for positioning said reticle and photosensitive substrate with respect to each other by observing a reticle alignment mark formed on said reticle and a substrate alignment mark formed on said photosensitive substrate;

wherein said alignment system comprises an imaging section having an imaging surface tilted with respect to an optical axis of said alignment system and with respect to a direction orthogonal to a measuring direction for each of said alignment marks, said imaging section having respective best focus positions for said alignment marks at different positions on said imaging surface; and wherein said alignment marks are simultaneously detected at said respective best focus positions so as to position said reticle and said photosensitive substrate with respect to each other.

2. A projection exposure apparatus according to claim 1, further comprising means for changing an angle of inclination of said imaging surface of said imaging section with respect to said optical axis of said alignment system.

3. A projection exposure apparatus according to claim 1, further comprising an image processing circuit for detecting a best focus position of said substrate alignment mark according to an image signal sent from said imaging section and detecting said substrate alignment mark at thus detected best focus position.

4. A projection exposure apparatus according to claim 1, wherein said photosensitive substrate is provided with a plurality of photosensitive layers for forming a number of layers of circuit patterns, and a plurality of substrate marks which respectively correspond to said layers and are respectively formed at positions whose depths from a surface of said photosensitive substrate differ from each other, and wherein said substrate alignment marks are simultaneously detected at respective best focus positions thereof.

5. A projection exposure apparatus according to claim 4, further comprising an image processing circuit for detecting respective best focus positions of said plurality of substrate alignment marks according to an image signal sent from said imaging section and detecting said substrate alignment marks at thus detected best focus positions corresponding thereto.

6. A projection exposure apparatus according to claim 3, wherein said image processing circuit detects a best focus position of said reticle alignment mark according to an image signal sent from said imaging section and detects said reticle alignment mark at thus detected best focus position.

* * * * *